US010755798B2

(12) United States Patent
Yang et al.

(10) Patent No.: US 10,755,798 B2
(45) Date of Patent: Aug. 25, 2020

(54) RECOVERING DATA FROM A FAULTY MEMORY BLOCK IN A MEMORY SYSTEM

(71) Applicant: Western Digital Technologies, Inc., San Jose, CA (US)

(72) Inventors: Niles Yang, San Jose, CA (US); Pitamber Shukla, San Jose, CA (US); Mohan Dunga, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/221,682

(22) Filed: Dec. 17, 2018

(65) Prior Publication Data

US 2020/0194094 A1 Jun. 18, 2020

(51) Int. Cl.
| | |
|---|---|
| *G11C 11/56* | (2006.01) |
| *G11C 29/52* | (2006.01) |
| *G11C 29/42* | (2006.01) |
| *G11C 29/44* | (2006.01) |
| *G06F 11/10* | (2006.01) |
| *G11C 11/4074* | (2006.01) |
| *G11C 11/4099* | (2006.01) |
| *G11C 16/28* | (2006.01) |

(52) U.S. Cl.
CPC .......... *G11C 29/52* (2013.01); *G06F 11/1048* (2013.01); *G06F 11/1068* (2013.01); *G11C 11/4074* (2013.01); *G11C 11/4099* (2013.01); *G11C 16/28* (2013.01); *G11C 29/42* (2013.01); *G11C 29/44* (2013.01)

(58) Field of Classification Search
CPC .................................................. G11C 11/5642
USPC .................................................... 365/185.02
See application file for complete search history.

(56) References Cited

U.S. PATENT DOCUMENTS 8,498,151 B1 * 7/2013 Winter ................ G11C 11/5642
365/185.02

* cited by examiner

*Primary Examiner* — Jason Lappas
(74) *Attorney, Agent, or Firm* — Dickinson Wright PLLC; Steven Hurles

(57) ABSTRACT

Recovering data from a faulty memory block in a memory system. Various methods include: reading a target word line in a memory block to obtain a first data; determining the first data has an uncorrectable error; and then adjust bias parameters of a first group of neighboring word lines within the memory block, where adjusting bias parameters creates a first adjusted bias parameters; and reading the target word line using the adjusted bias parameters to obtain second data from the target word line. The method also includes determining the second data has a second uncorrectable error; and then adjusting bias parameters of a second group of lines within the memory block, where adjusting the bias parameters of the second group creates second adjusted bias parameters; and reading the target word line using the first and second adjusted bias parameters to obtain a third data from the target word line.

16 Claims, 11 Drawing Sheets

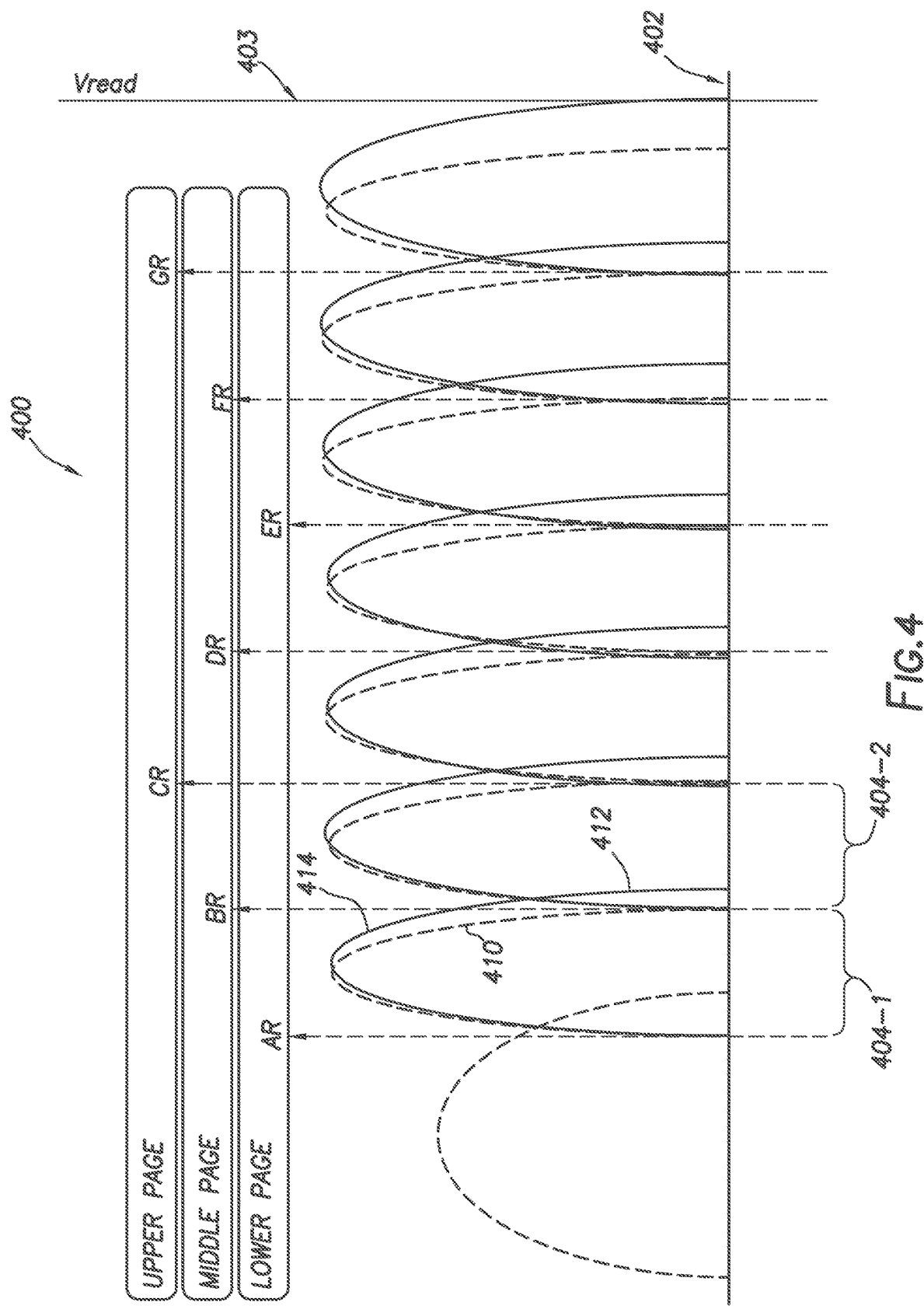

RECOVERING DATA FROM A FAULTY MEMORY BLOCK IN A MEMORY SYSTEM

BACKGROUND

Non-volatile memory systems provide a type of computer memory that retains stored information without requiring an external power source. One type of non-volatile memory, flash memory, is widely used in various computing devices and in stand-alone memory devices. For example, flash memory can be found in laptops, digital audio player, digital cameras, smart phones, video games, scientific instruments, industrial robots, medical electronics, solid state drives, USB drives, memory cards, and the like.

Various implementations of flash memory aim to increase storage capacity. For example, the implementation and architecture of flash memory enables single level cell (SLC) devices, where each cell stores one bit of information, and multi-level cell (MLC) devices including triple-level cell (TLC) devices, where each cell can store more than one bit of information. Additional advances in flash memory also include changes in the flash memory architecture that stack memory cells (3D NAND) in order to increase storage capacity at a reduced cost per gigabyte.

As flash memory continues to increase in storage capacity and density, the various memory cells can become increasingly difficult to read. To balance the need for increased density with a desire for accuracy, various solutions include the use of error-correcting code (ECC) and read error handling (REH) that, respectively, encode and decode the data readout and correct errors.

SUMMARY

Various embodiments include a method for recovering data from a faulty memory block in a memory system. The method includes reading a target word line in a memory block to obtain a first data; determining the first data has an uncorrectable error; and then adjusting bias parameters of a first group of neighboring word lines within the memory block, where adjusting bias parameters creates first adjusted bias parameters. The method also includes reading the target word line using the adjusted bias parameters to obtain second data from the target word line.

The method further includes determining the second data has a second uncorrectable error; and then adjusting bias parameters of a second group of lines within the memory block, where adjusting the bias parameters of the second group creates second adjusted bias parameters. The method also includes reading the target word line using the first and second adjusted bias parameters to obtain a third data from the target word line.

Other embodiments include a method for detecting a faulty memory block in a memory system. The method includes reading a target word line in a memory block to obtain a first data; determining the first data has an uncorrectable error; and then adjusting bias parameters of a first group of neighboring word lines within the memory block, where adjust bias parameters creates first adjusted bias parameters. The method further includes reading the target word line using the adjusted bias parameters to obtain second data from the target word line; determining the second data has a second uncorrectable error; and then adjusting bias parameters of a second group of lines within the memory block, where adjusting the bias parameters of the second group of lines creates second adjusted bias parameters. The method further includes reading the target word line using the first and second adjusted bias parameters to obtain a third data from the target word line; determining the third data has an uncorrectable error; and marking the memory block as faulty.

Additional embodiment include a memory controller, including: a first terminal coupled to a memory block; processing circuitry coupled to the first terminal; and a memory coupled to the processing circuitry, the memory storing computer-readable instructions that when executed by the processing circuitry, cause the memory controller to: receive a first data and a first address of the first data, wherein the first address defines a target word lien corresponding to a memory cell in the memory block; determine the first data has an uncorrectable error; and then adjust first bias parameters of a first group of neighboring word lines within the memory block by a predetermined threshold; the adjusting creates first adjusted bias parameters, wherein the first group of neighboring word lines comprises a first word line immediately adjacent to the target word line. The computer-readable instructions further cause the memory controller to read the target word line using the first adjusted bias parameters; and receive a second data from the first address.

BRIEF DESCRIPTION OF THE DRAWINGS

For a detailed description of example embodiments, reference will now be made to the accompanying drawings in which:

FIG. 4 illustrates a distribution curve, in accordance with some embodiments.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

At least some of the example embodiments are directed to recovering data from a faulty memory block in a memory system. The faulty memory block is detected when a read handling error occurs during a read of a target word line in the faulty memory block. An attempt to recover data is made in a first pass by adjusting the bias parameters applied to the non-read word lines of the memory block. If unsuccessful, an attempt to recover data is made in a second pass by adjusting the bias parameters of the select lines and the dummy word lines of the faulty memory block. In particular, in the first attempt to recover the data, the bias parameters are adjusted by increasing the read pass voltages applied to non-read word lines that are near the target word line. In the second attempt to recover the data, the voltages on the control lines as well as on dummy word lines are increased. The specification now turns to an example computer architecture that utilizes memory, in accordance with example embodiments.

Figure 1A:
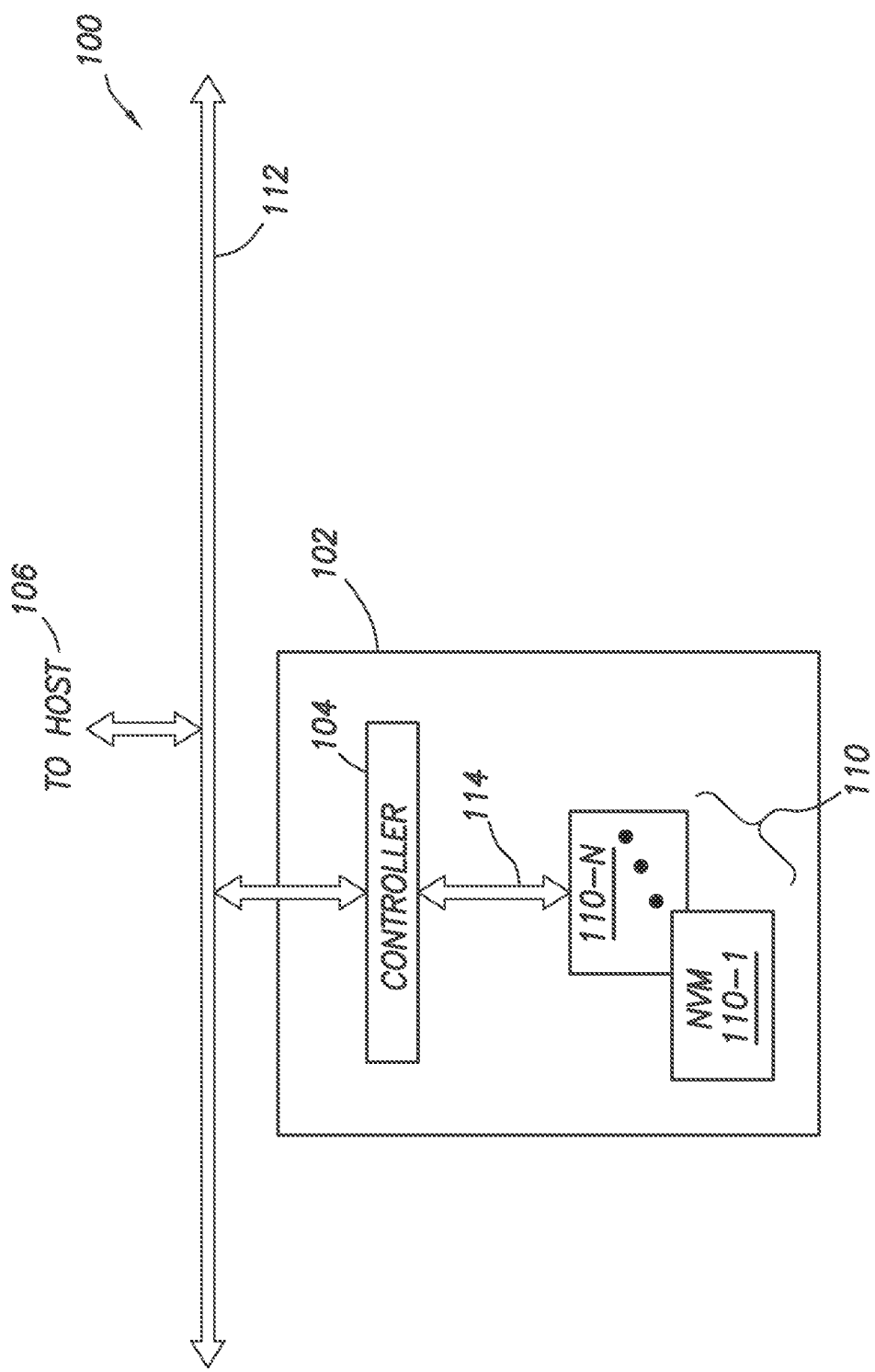
FIGS. 1A-1B illustrates a block diagram of an example non-volatile memory system, in accordance with some embodiments.

FIG. 1A illustrates a block diagram of an example system architecture 100 including non-volatile memory. In particular, the example system architecture 100 includes storage system 102, a controller 104, and a host 106. In various embodiments, the host 106 can include any device or system that utilizes the storage system 102. The host 106 can include its own controller (e.g., a processor) configured to execute instructions stored in the storage system 102 and further the host 106 can access data stored in the storage system 102.

Examples of the host 106 can include computing devices such as a desktop computer, rack mounted server, a laptop, a smartphone, a tablet, and the like. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Furthermore, the host 106 can require adapters into which a memory card is plugged. The foregoing examples of a host are not meant to be limiting examples. On the contrary, a host 106 can include any type of device, system, and apparatus that accesses the storage system 102.

In FIG. 1A, the storage system 102 can include its own memory controller and drivers (e.g., controller 104)—as will be described further below—but other embodiments of the storage system 102 can include memory-only units that are instead controlled by software executed by a controller on the host 106 (e.g., a processor of a computing device controls—including error handling of—the storage unit 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate to the storage system 102 by way of a bus 112 that can implement any known or after developed communication protocol, such as Secure Digital (SD) protocol, Memory stick (MS) protocol, USB protocol, or Advanced Microcontroller Bus Architecture (AMBA). It is noted that the foregoing examples of communication protocols are not meant to be limiting examples. On the contrary, any communication protocol can be used that enables the storage system 102 and the host 106 to communicate.

In various embodiments, the controller 104 acts as an interface between the host 106 and the storage system 102. The controller 104 can include individual circuit components, processing circuitry (e.g., logic gates and switches), a processor, a microprocessor, a microcontroller with controlling software, or a field programmable gate array (FPGA). Furthermore, the controller 104 includes a computer-readable medium that stores computer-readable program code (e.g., software or firmware) executable by the processor. In some embodiments, the controller 104 is a flash memory controller.

Still referring to FIG. 1A, according to some embodiments, the controller 104 manages data stored on the storage system 102 and communicates with the host 106. For example, in a case where the storage system 102 includes flash memory, the controller 104 formats the flash memory to ensure the memory is operating properly, maps out bad flash memory cells, and allocates spare cells to be substituted for future failed cells. Additionally, some parts of the spare cells are used to hold firmware to operate the flash memory controller (e.g., the controller 104), as well as implement other features.

When the host 106 reads data from or writes data to the memory system 102, the host 106 communicates with the controller 104. In one example, the host 106 provides to the controller 104, a logical address to which data is to be read or written. Upon receiving the logical address, the controller 104 performs the operations of converting the logical address to a physical address in the storage system 102. Although the foregoing tasks have been described as being performed by the controller 104, these tasks are not limited to being performed only by the controller 104. To the contrary, the host 106 can also perform these tasks. For example, the host 106 can provide the physical address to the controller 104, in some cases.

In the example where the storage system 102 includes flash memory, the controller 104 also performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which includes several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several different sets of memory die. The manner in which the NVM block 110 is defined in FIG. 1A is not meant to be limiting.

Each memory die, for example memory die 110-1, includes non-volatile memory cells, such as NAND flash memory cells or NOR flash memory cells. As the memory cells are non-volatile, the memory cells in the storage system 102 retain data even when there is a break in the power supply. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers.

According to some embodiments, and as shown in FIG. 1A, the controller 104 and the NVM block 110 are communicatively coupled by an interface 114 that can implement any known or after developed communication protocol. In embodiments where the storage system 102 is flash memory, the interface 114 is a flash interface, such as Toggle Mode 200, 400, or 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established can vary based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

The methods described herein are directed to recovering data from a faulty memory block in the storage system 102. The faulty memory block is detected when a read handling error occurs during a read of a target word line in the faulty memory block. Prior to describing the methods in accordance with various embodiments, additional aspects of the storage system 102 are described.

Figure 1B:
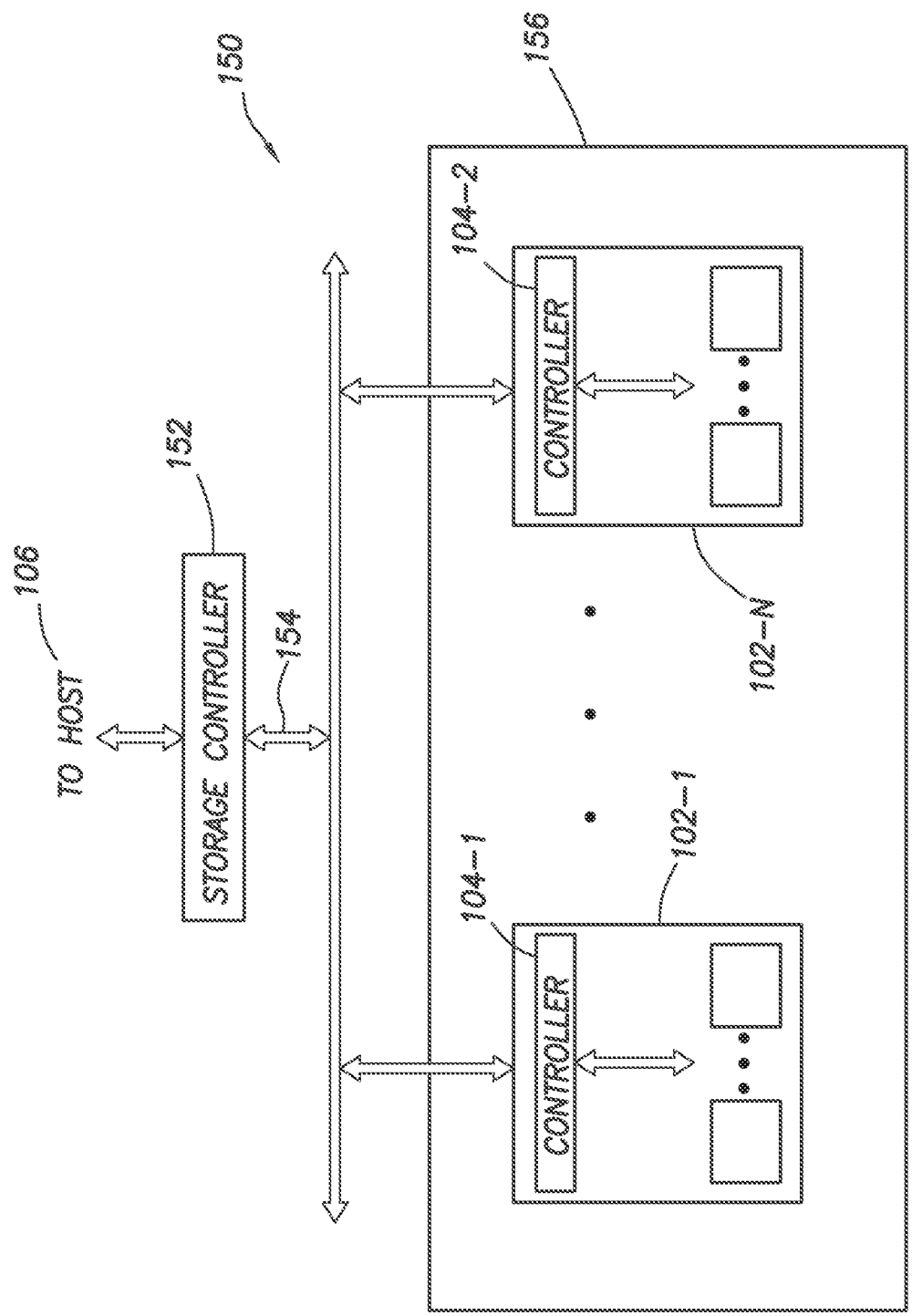

More specifically, and as shown in FIG. 1B, the system architecture 100 can be implemented as part of a larger system architecture. For example, as shown in FIG. 1B, the system architecture 150 includes a storage module 156 that further includes several storage systems 102. Within the system architecture 150 the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components. Next, additional details of the controller 104 are described.

Figure 2A:
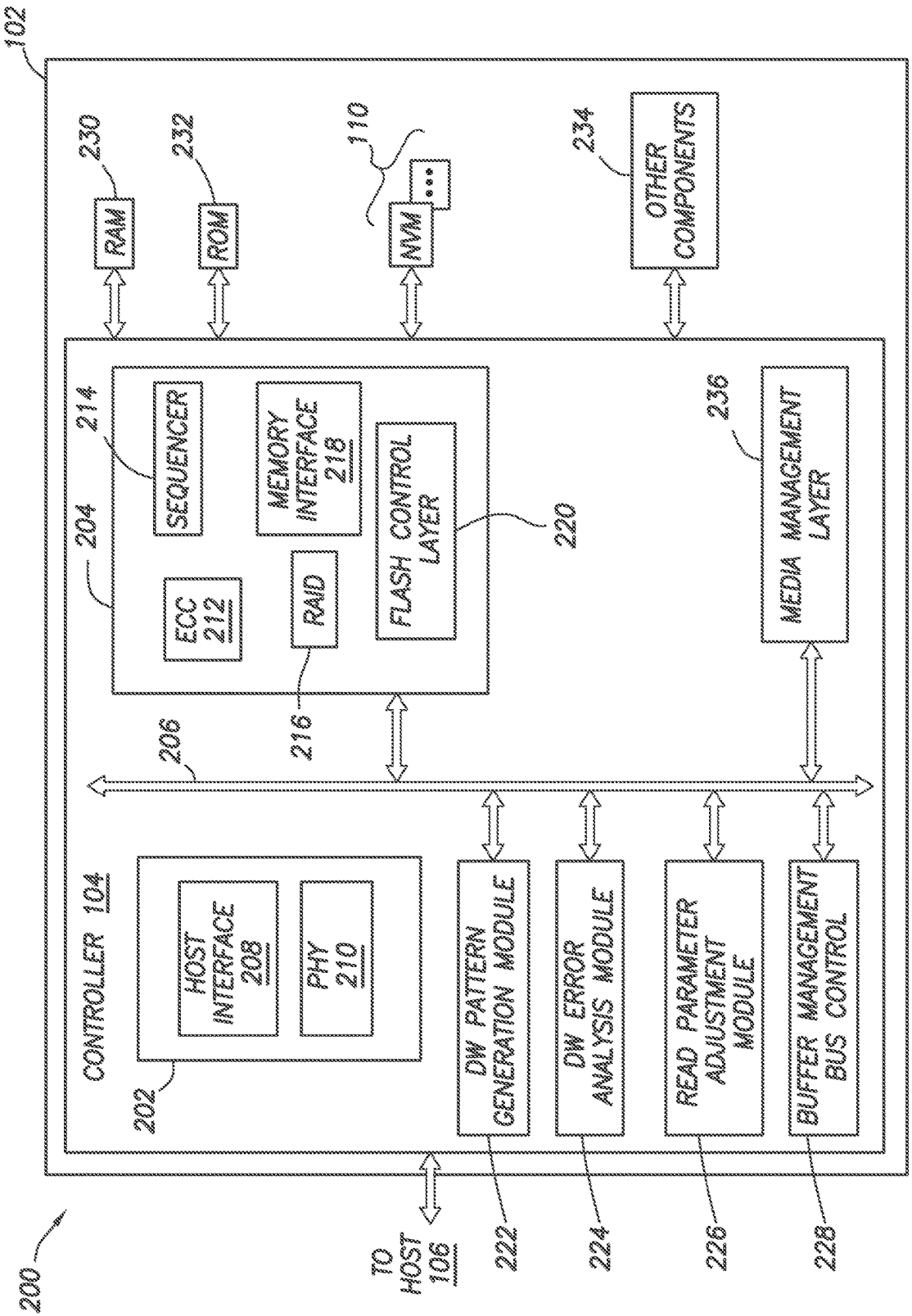
FIG. 2A illustrates a block diagram of example components of a controller, in accordance with some embodiments.

In FIG. 2A, a block diagram 200 of the storage system 102 illustrates additional details with respect to the controller 104 (introduced in FIG. 1A). The block diagram 200 of the storage system 102 illustrates components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. To the contrary, the RAM 230 and the ROM 232 can be located within the controller 104, portions of the RAM 230 or ROM 232, respectively, can be located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

The discussion now turns to the various modules that can be included within the controller 104. In accordance with various embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. Further still, the various modules are not limited to being executed within the controller 104. That is, in some embodiments, one or more modules can be executed outside the controller 104. It is noted, the controller can be configured with hardware and/or firmware to perform the various functions described herein. For example, some of the components shown as being internal to the controller can also be stored external to the controller.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 102 is implemented within the host 106.

The module 202, interfaces with the host 106 and includes a host interface 208 and a physical layer interface 210 that provides the electrical interface between the host 106 or next level storage controller and the controller 104. In various embodiments, the host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 communicates with the NVM block 110. The module 204 can couple a first terminal of the controller 104, where the first terminal of the controller 104 couples to the NVM block 110. The module 204 includes an error correction controller (ECC) engine 212. In some embodiments, the ECC engine 212 encodes data received from the host 106, where the encoded data is stored within the NVM block 110. When the data is read out from the NVM memory block 110, the ECC engine 212 decodes the data and corrects errors detected within the data.

The module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the non-volatile memory die 110. In some embodiments, the ECC engine 212 implements the functions of the RAID module 216.

The module 204 also includes a memory interface 218 that provides the command sequences to the NVM memory block 110 and receives status information from the NVM memory block 110. For example, the memory interface 218 can implement any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 can include a dummy word line (DW) pattern generation module 222, a DW error analysis module 224, and a read parameter adjustment module 226. As described in further detail below—a non-volatile memory die can include dummy word lines that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example, the read parameters adjustment module 226 can adjust parameters associated with a particular non-volatile memory die based on errors detected in a dummy word line. Furthermore, the read parameter adjustment module 226 can adjust various parameters associated with a particular memory block outside of scenarios where an error is detected in a dummy word line—for example during a read error handling operation and as described further below.

Additional modules within the controller 104 include a buffer manager/bus controller 228 that manages buffers in the RAM 230 and controls the internal bus arbitration of the bus 206 in the controller 104. Additionally, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 114 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110. Accordingly, modules and components within an example controller 104 have been described.

Figure 2B:
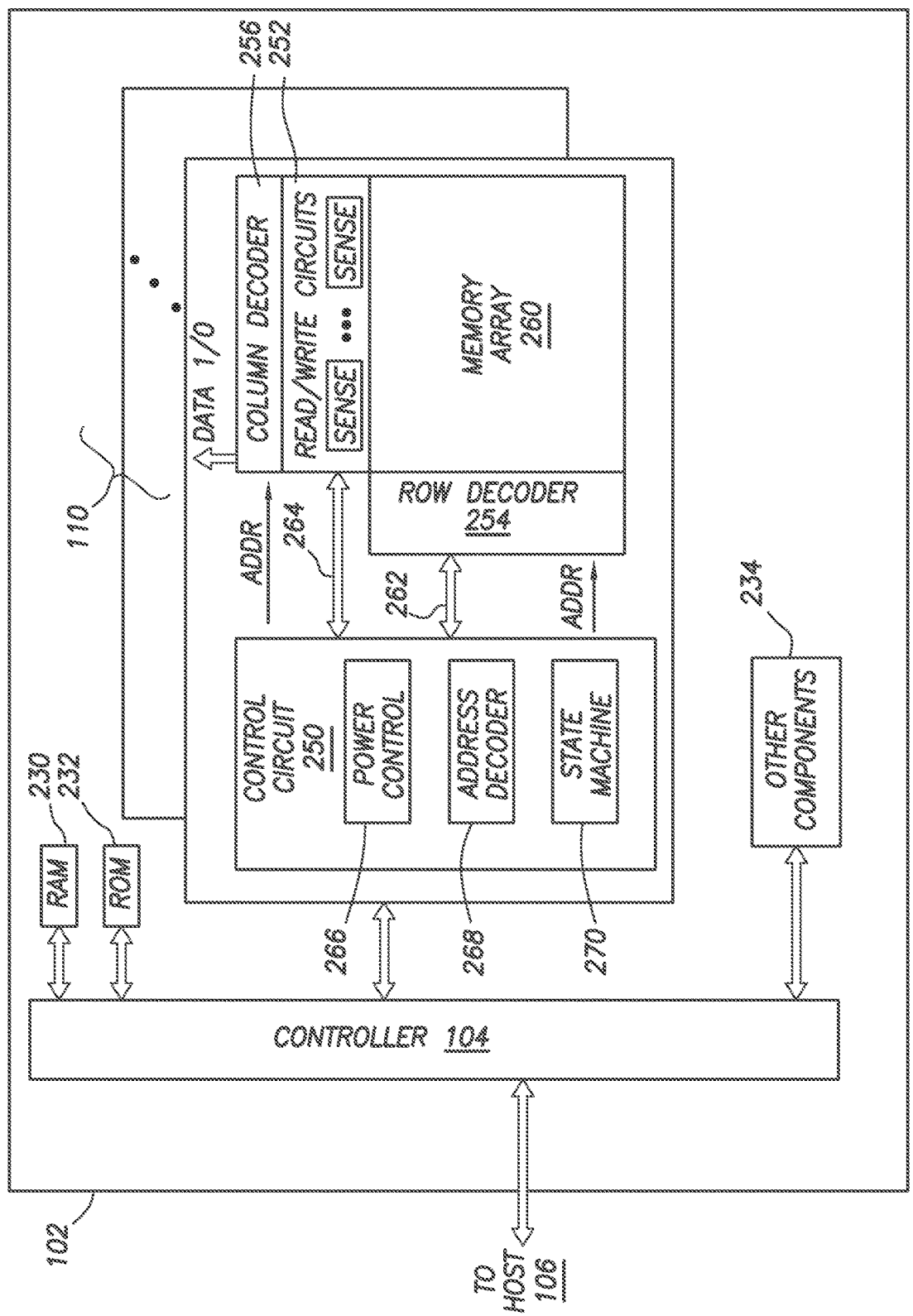
FIG. 2B illustrates a block diagram of example components of a non-volatile memory storage system, in accordance with some embodiments.

FIG. 2B shows a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all the memory die within NVM memory block 110.

In various embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

Still referring to FIG. 2B, in various embodiments, the control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. In some embodiments, the power control circuit 266 can include a charge pump that creates voltages larger than the supply voltage. The address decoder 268 provides an address interface that translates addresses between addresses provided by the host 106 and addresses used by the row decoder 254 and the column decoder 256. For example, the address decoder 268 can convert an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed when a read error is encountered during a read operation.

Figure 3:
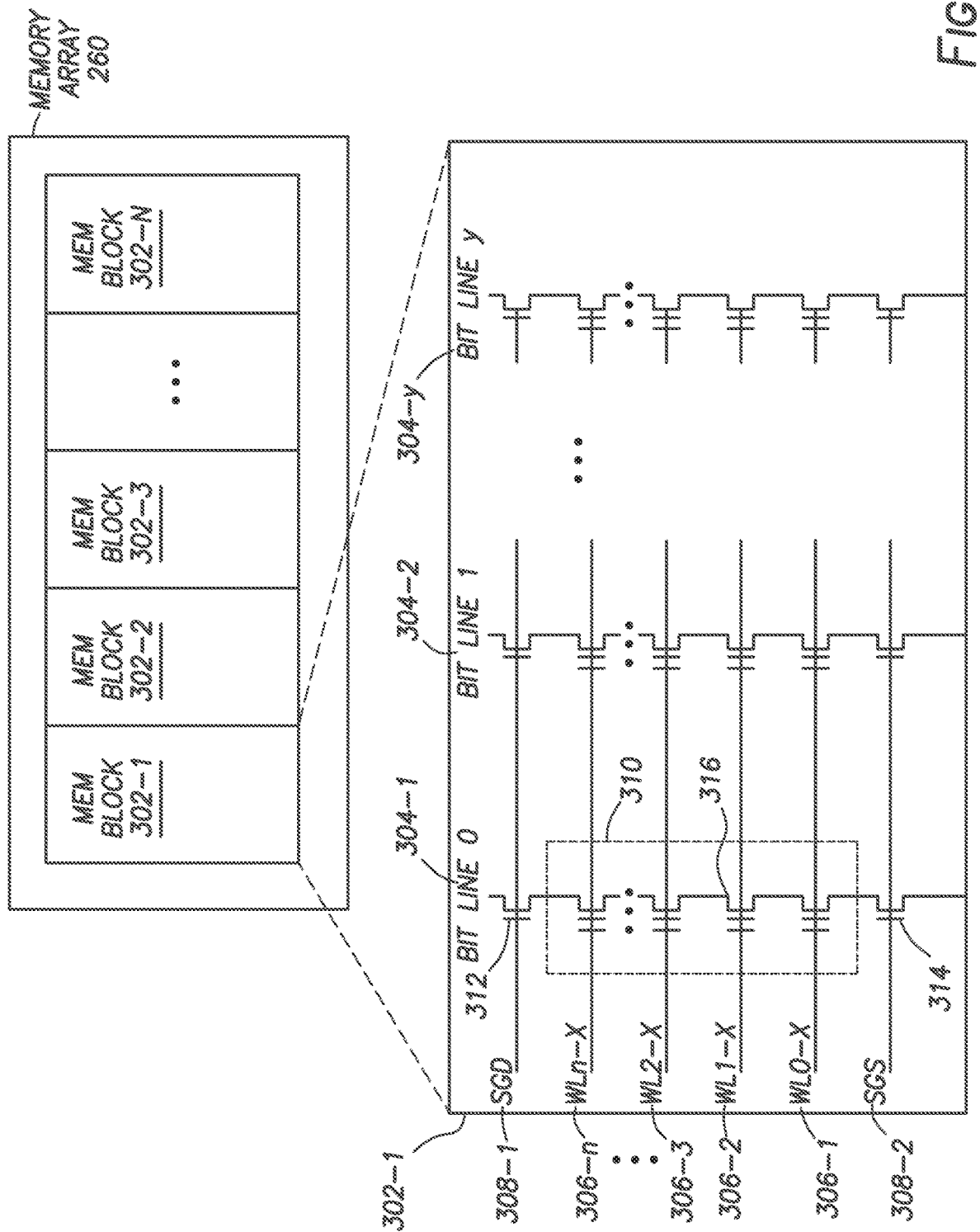
FIG. 3 illustrates a memory block, in accordance with some embodiments.

In accordance with various embodiments, as shown in FIG. 3, the memory array 260 can be divided into several memory blocks 302. In flash memory, a memory block is defined as a unit of erase. That is, each block 302 includes the minimum number of memory cells that are erased together or as a block. In some embodiments, the memory array 310 includes 1,024 blocks. However, the memory array 310 can be partitioned into more or fewer blocks. Additionally, other embodiments can use a different unit of erase.

Each block 302, for example block 302-1, can include columns corresponding to bit lines 304, where each column is accessed by a respective bit line. Furthermore, each block 302 can include word lines 306 and select lines 308. The method in which each memory cell is accessed and the number of memory cells accessed during a read or write varies. For example, all of the bit lines of the block 302-1 can be simultaneously selected during read and program operations. In various embodiments, memory cells along a common word line can be programmed at the same time (i.e., concurrently). In other embodiments, the bit lines can be divided into even bit lines and odd bit lines. In an odd/even bit line architecture, memory cells along a common word line and connected to the odd bit lines are programmed at one time, while memory cells along a common word line and connected to an even bit line are programmed at a different time.

Each bit line, for example bit line 304-1, is connected to several memory cells connected in series. More particularly, in an embodiment where each memory cell is a floating gate transistor, the floating gate transistors are connected in series to form a NAND string 310 (e.g., NAND string 310 within the dashed box). Although four memory cells are shown in FIG. 3, the number of memory cells within the NAND string is not meant to be limiting. For example, 16, 32, 64, 128, or any other number of memory cells can be connected in a NAND string.

A first terminal of the NAND string 310 is connected to a corresponding bit line (e.g., bit line 304-1) by a select transistor 312 that is in turn controlled by the select gate drain line (SGD) 308-1. A second terminal of the NAND string 310 is connected to another select transistor 314 that is in turn controlled by the select gate source line (SGS) 308-2.

Still referring to FIG. 3, in order to read data in a particular memory cell (e.g., memory cell 316), all other memory cells or unselected memory cells within the NAND string 310 are turned on (e.g., conducting current regardless of whether they are programmed or erased). In various embodiments, the unselected memory cells have a bias parameter (e.g. a read pass voltage) applied to their respective word lines that turn on the memory cells.

During the example read operation, the word line 306-2 is connected to a voltage having a level that is specified for the read operation (e.g., read compare levels) in order to determine whether a threshold voltage of the memory cell 316 has reached a particular level. After all unselected memory cells have a bias parameter (e.g., a read pass voltage) applied and a voltage level is applied to the word line 306-2, the conduction current of the memory cell 316 is measured to determine the value stored within the memory cell 316.

Each of the memory blocks 302 can be divided into a number of pages defined as a unit of programming. In one embodiment, a page of data can be stored in one row of memory cells. Each page can include user data and overhead data, where the overhead data includes ECC that has been calculated from the user data. Recall in various embodiments, the controller 104 calculates the ECC when data is programmed into the memory array 260 and subsequently checks the data when the data is read from the memory array 260. In other embodiments, the state machine 270 or other component can calculate and check the ECC. In other embodiments, the ECC and other overhead data are stored in different pages, or even different memory blocks, than the user data to which they pertain.

Still referring to FIG. 3, the rate at which memory cells can be programmed or erased varies based on factors such as manufacturing variations (e.g., silicon), variation during operation (e.g., temperature of the memory die 110 during a write versus a read), and variations correlated to time and use (e.g., age of the memory die 110, wear, and the like). For example, some memory cells are slower to program or erase because those cells were previously erased to a lower threshold voltage than others or because of uneven wear among the memory cells.

Additionally, some memory cells program faster and can be over programmed, which also causes an error. FIG. 4 shows a distribution graph 400 that illustrates how the resultant compare voltages can shift due to over programming. In particular, FIG. 4 illustrates a distribution graph where the x-axis 402 correlates to a voltage value, where a respective range of voltage values fall within a Vread bucket (e.g., Vread buckets 404), and the y-axis 404 correlates to a number of memory cells. For example, the first Vread bucket 404-1 includes a first range of voltage values that correlates to a certain amount (within a range) of charge stored in a memory cell. All memory cells that fall within the Vread bucket 404-1 are determined to a store a first value. Additionally, another Vread bucket 404-2 includes a second range of voltage values that correlates to a certain amount (within a range) of charge stored within a memory cell. A memory cell that falls within the Vread bucket 402-2 is determined to store a second value.

The distribution curve 410 represents a distribution where the memory cells fall within the expected Vread buckets. However, when over programming occurs, the distribution curve shifts slightly to develop a tail, such as seen in the distribution curve 414 (e.g., tail 412). Accordingly, a memory cell that was originally programmed to fall within the Vread bucket 404-1 can result in an error during a read operation if the memory cell is determined to fall within the Vread bucket 404-2. A method is described next, that addresses such an error.

Figure 5A:
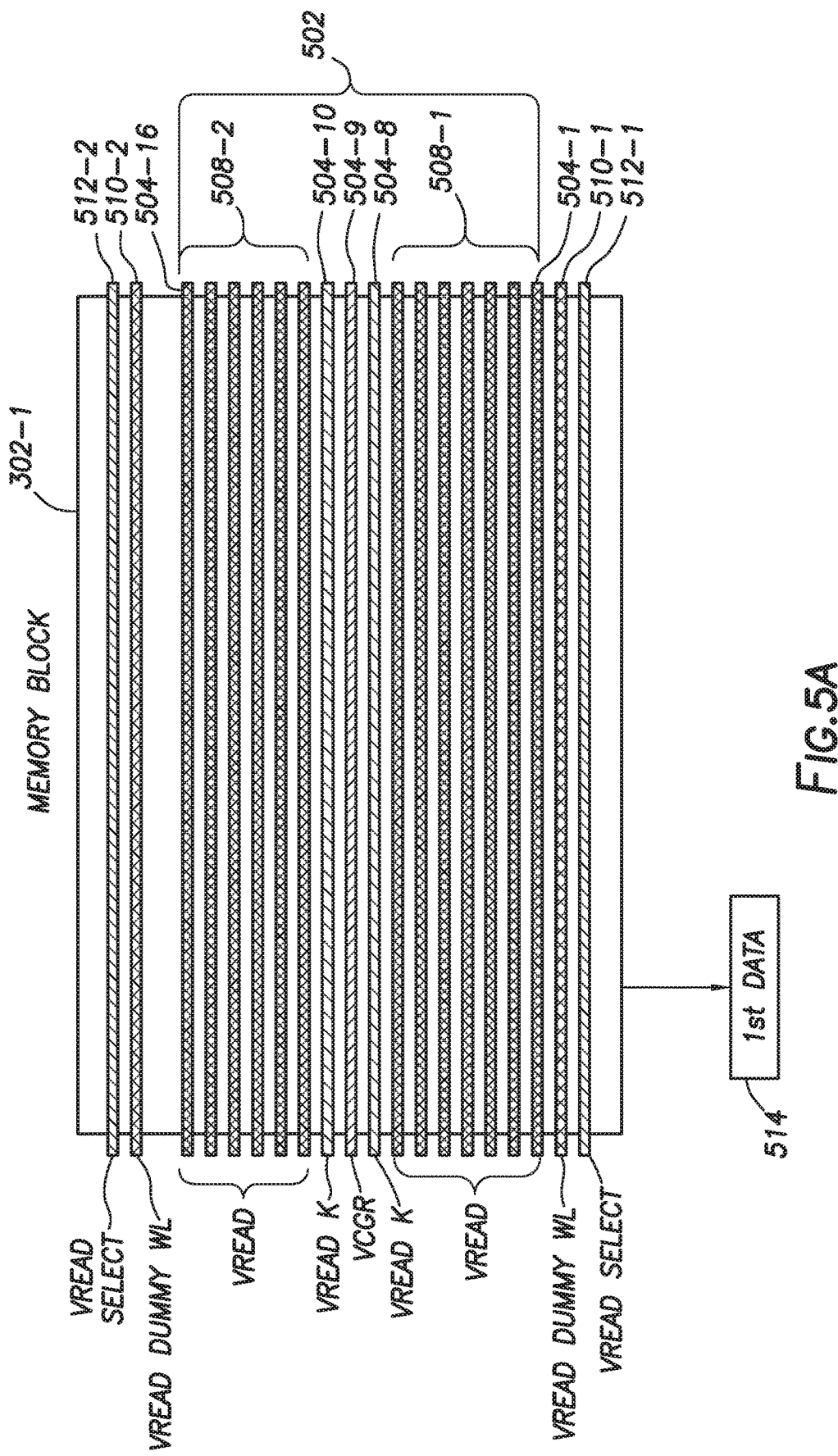
FIGS. 5a-5c illustrate conceptual and method diagrams in which a memory block is read, in accordance with some embodiments.
Figure 5B:
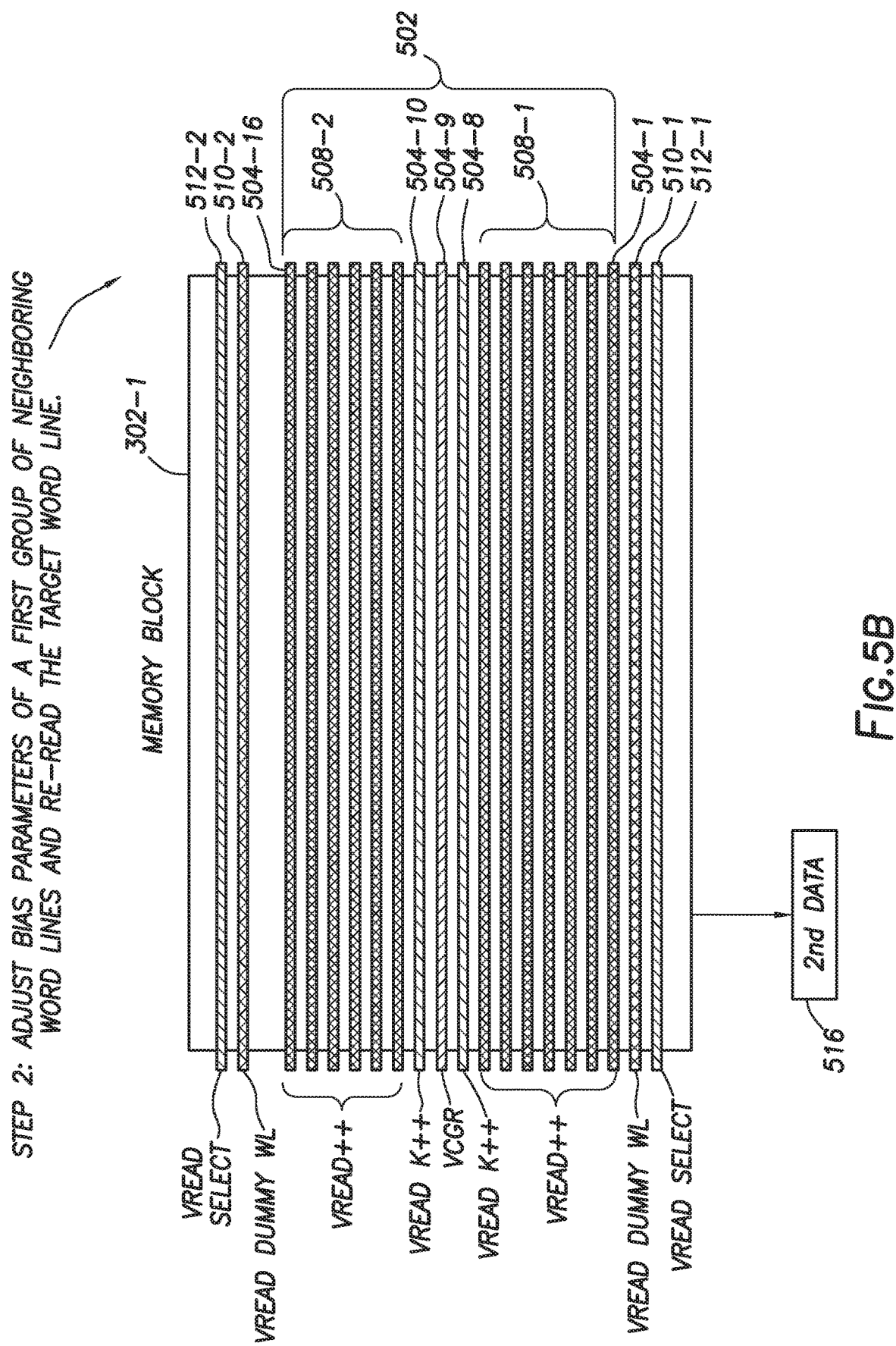
Figure 5C:
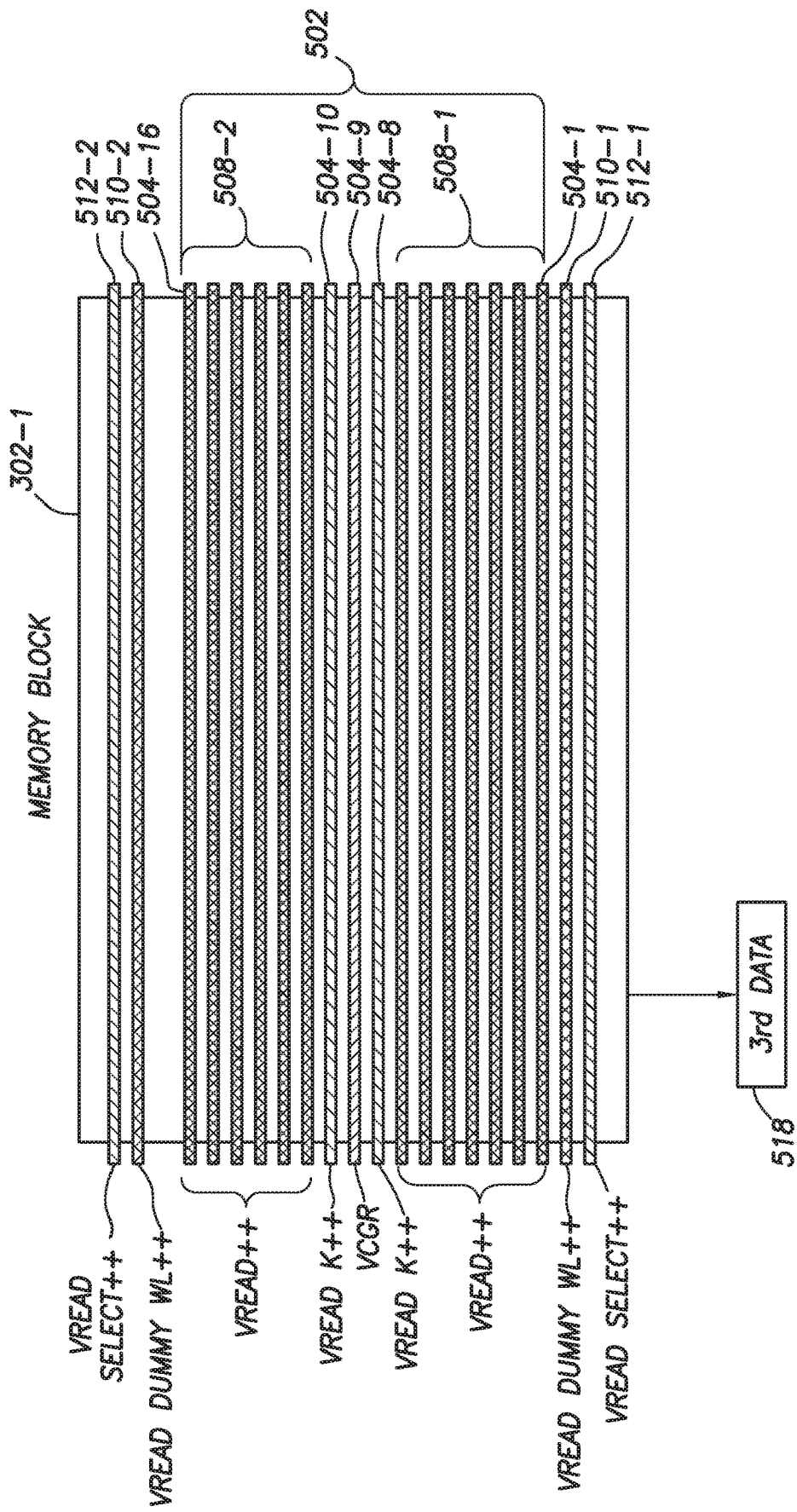

FIGS. 5A-5C illustrate conceptual and method diagrams in which an example memory block is read, according to some embodiments. In particular, for purposes of this example, the data that is read out of the memory block initially encounters a read error that is uncorrectable. The conceptual and method diagrams in FIGS. 5A-5C describe a method in which the data can be recovered after encountering the read error. The method in accordance with various embodiments includes adjusting the bias parameters of neighboring word lines, dummy word lines, and select lines.

Initially, an example memory block 302-1, as shown in FIG. 5A, illustrates an example memory block that can be read in accordance with the methods described herein. In particular, the memory block 302-1 includes 16 word lines 502 represented by rows disposed across the memory block 302-1. A word line of the word lines 502 connects to several memory cells, each memory cell connected to their respective NAND strings.

For the sake of this discussion, a first word line 504-1 is disposed near a bottom portion of the memory block 302-1, and subsequent word lines are disposed in an ascending manner up the memory block 302-1, where the word line 504-16 is disposed near a top portion of the memory block 302-1. In this example, a target word line 504-9 is located in a middle portion of the memory block 302-1 and is surrounded by immediately adjacent neighboring word lines 504-8 and 504-10. The target word line 504-9 can also be considered to be surrounded by additional groups of word lines 508-1 and 508-2. In particular, the group of word lines 508-1 includes seven word lines (e.g., word lines 508-1-508-7) disposed below the target word line 504-9, while the group of word lines 508-2 includes six word lines (e.g., word lines 508-10-508-16) disposed above the target word line 504-9.

The immediately adjacent neighboring word lines 504-8 and 504-10 and the groups of word lines 508-1 and 508-2 are defined as a first group of word lines 504. The positioning of the target word line 504-9 within the memory block 302-1 is not meant to be limiting and the methods described herein can apply to any target word line located within any position of the memory block 302-1. For example, the target word line during another read cycle can be the word line 504-1.

The memory block 302-1 also includes two dummy word lines 510 disposed along the periphery of the memory block 302-1. That is, one word line 510-1 is disposed below the word lines 502 and the other dummy word line 510-2 is disposed above the word lines 502. Additionally, two select lines are disposed along the edges of the memory block 302-1. The select line 512-1 is disposed below the dummy word line 510-1 and the select line 512-2 is disposed above the word line 510-2. For discussion purposes, the select lines 512 and the dummy word lines 510 define a second group of lines.

Still referring to FIG. 5a, in accordance with some embodiments, in Step 1 the target word line 504-9 is read and the system encounters an uncorrectable error. That is, consider for purposes of discussion that the data read out of target word line 504-9 contains errors. To perform the read, the storage system 102 applies a select voltage to the select lines and read pass voltages to all the other word lines. For example, a bias parameter of VREADK (e.g., a read pass voltage) is applied to the immediately adjacent neighboring word lines 504, a bias parameter of VREAD (e.g., a read pass voltage) is applied to the group of word lines 508, a bias parameter of VREAD DUMMY WL (e.g., a read pass voltage) is applied to the dummy word lines 510, and a bias parameter of VREAD SELECT is applied to the select lines 512.

In some examples, VREADK is around 10 voltages and VREAD is around 9 voltages. In other examples, VREADK is 8 voltages, VREAD is 7 voltages, VREAD DUMMY WL is 7 voltages, and VREADSELECT is 8 voltages. Thus the word lines that are immediately adjacent (e.g., the word lines 504-8 and 504-10) can have bias levels that are different from the extended neighbors (e.g., word lines 508). While read pass voltages are applied to neighboring word lines, a bias parameter of VCGR (e.g., a read voltage) is applied to the target word line 504-9.

Subsequently a first data 514 associated with a memory cell connected to the target word line 504-9 is read out. For purposes of discussion the first data 514 contains an error that results in a read error detected by various ECC algorithms including an LDPC (low-density parity-check) code, BCH (Bose-Chaudhuri-Hocquenghem) codes, a soft read, extra parity, and the like.

In various embodiments, the ECC engine 212 applies an ECC algorithm on the first data 514 and creates an ECC output, which the ECC engine 212 then compares to a previously stored ECC output. The previously stored ECC result can be stored as part of overhead data (previously described with respect to FIG. 3). One of two outcomes can result from the comparison. One outcome can include a conclusion that the ECC output and the previously stored ECC output match. This outcome indicates the first data 514 is not corrupt and the first data 514 does not need to be processed further. However, recall that for the purposes of this discussion, the first data 514 does contain errors.

The other outcome is the conclusion that the ECC output and the previously stored ECC output do not match. This outcome indicates the first data 514 is corrupted and the ECC engine 212 can perform further processing on the first data 514. When the two ECC outputs do not match, the ECC engine 212 executes a read error handling (REH) process. In one REH process for example, when the two ECC outputs do not match, the ECC engine 212 attempts to correct individual bits in the first data 514 which creates modified first data. After attempting to correct the individual bits in the first data 514, the ECC engine 212 applies the ECC algorithm on the modified first data and creates a second ECC output.

In this example REH process, if the ECC engine determines the two ECC outputs (e.g., as between the previously stored ECC output and the second ECC output) match, the ECC engine 212 transmits an indication that the error correction was successful. However, if the ECC engine determines the two ECC outputs (e.g., as between the previously stored ECC output and the second ECC output) do not match, the ECC engine 212 transmits an indication that the error correction was unsuccessful or an uncorrectable error indication. In various embodiments, the uncorrectable error can occur when the first data 514 includes more bits that are corrupted than the ECC engine 212 has the ability to correct. In the related art, the process ends with the uncorrectable error and the original data is not recovered. However, in the disclosed method, additional steps can be taken to overcome the uncorrectable error and recover the original data.

In FIG. 5B, Step 2, bias parameters of the first group of word lines 504 are adjusted and the target word line is re-read. In various embodiments, the bias parameters can be adjusted by way of the read parameter adjustment module (FIG. 2A) and the power control circuit 266 (FIG. 2B). For example, during the re-reading of the target word line (i.e., a second read), the original bias parameters applied to the first group of word lines 508 (e.g., VREADK) and 510 (e.g., VREADK) are increased. In some embodiments, the bias parameters can be increased by the same offset or voltage amount. In other embodiments, the bias parameters can be increased by different amount based on a location of a particular word line to the target word line 504-9.

As illustrated in FIG. 5B, for the second read, the bias parameters can be adjusted, by a predetermined threshold, such that the read pass voltages are increased, on the first group of word lines 504 including the word lines 504 (e.g., VREADK++) and the groups of word lines 508 (e.g., VREAD++). In various embodiments, the predetermined threshold can vary between 0.5 mV-2V. In other embodiments, the predetermined threshold can vary between 0.2 mV-5V. In one example, both VREAD and VREADK are each respectively increased by 1 voltage; accordingly the voltage of VREAD is increased to 8 voltages and the voltage of VREADK is increased to 9 voltages. One range for VREADK++ is 8.5-10 voltages, while a range for VREAD++ is 7.5-9 voltages. During the second read, the bias parameters applied to the second group of lines including the dummy word lines 510 and the select lines 512 remain the same as before (e.g., VREAD DUMMY WL is 7 voltages and VREAD SELECT is 8 voltages, respectively). With the adjusted bias parameters on the first group of word lines 504, data is read out of the target word line 504-9 using VCGR, as second data 516.

Similar to the ECC operations performed in Step 1, the ECC engine 212 applies an ECC algorithm on the second data 516 and creates an ECC output, which the ECC engine 212 then compares to the previously stored ECC output. The previously stored ECC result is the same as was used in Step 1, which is stored as part of the overhead data. As previously discussed in Step 1, two outcomes can occur. The first outcome is a conclusion that the ECC output and the previously stored ECC output match. This outcome indicates the second data 516 is not corrupt and the second data 516 does not need to be processed further. Essentially, with this first outcome, the original data stored within the memory block 302-1 is successfully retrieved. In such a manner, in some embodiments, increasing the read pass voltages of the neighboring word lines and extended neighboring word lines that are disposed around a target word line can resolve an uncorrectable error.

The second outcomes is the conclusion that the ECC output and the previously stored ECC output do not match. This outcome indicates the second data 516 is corrupt and the ECC engine 212 performs further processing on the second data 516. When the two ECC outputs do not match, the ECC engine 212 executes an REH process. In one example REH process, the ECC engine 212 attempts to correct individual bits in the second data 516 which creates modified second data. After attempting to correct the individual bits in the second data 516, the ECC engine 212 can apply the ECC algorithm on the modified second data and create an additional ECC output.

Similar to Step 1, in Step 2, if the ECC engine determines the two ECC outputs (e.g., as between the previously stored ECC output and the additional ECC output) match, the ECC engine 212 transmits an indication that the read error handling was successful. However, if the ECC engine determines the two ECC outputs (e.g., as between the previously stored ECC output and the additional ECC output) do not match, the ECC engine 212 transmits an indication that the read error handling was unsuccessful or an uncorrectable error indication. The uncorrectable error can occur when the second data 516 includes more bits that are corrupt than the ECC engine 212 has the ability to correct. In the disclosed method, additional steps can be taken in an attempt to recover the original data, as described in FIG. 5C.

In FIG. 5C, Step 3, bias parameters of the second group of lines including the dummy word lines 510 and the select lines 512 are also adjusted and the target word line 504-9 is re-read. Similar to Step 2, in Step 3, the bias parameters are adjusted, by a predetermined threshold, such that the read pass voltage are increased on the dummy word lines 510 (e.g., VREAD DUMMY WL++) and the select voltage levels are increased on the select lines 512 (VREADSELECT++). In various embodiments, the predetermined threshold can vary between 0.5 mV-2V. In other embodiments, the predetermined threshold can vary between 0.2 mV-5V. In one example, both VREAD DUMMY WL and VREADSELECT are each respectively increased by 1 voltage; accordingly, the voltage of VREAD DUMMY WL is increased to 8 voltages and the voltage of VREADSELECT is increased to 9 voltages. One range for VREAD DUMMY WL++ is 7.5-9 voltages, while a range for VREADSELECT++ is 8.5-10 voltages. During the re-read of the target word line 504-9 the adjusted bias parameters from Step 2 are also applied in conjunction with the adjusted bias parameters on the second group of lines. With the adjusted bias parameters on word lines 504, 508, and 510 and select lines 512, data is read out of the target word line 504-9 using VCGR, as third data 518.

Similar to the ECC operations described in Steps 1 and 2, the ECC engine 212 applies an ECC algorithm on the third data 518 and creates an ECC output, which the ECC engine 212 then compares to the previously stored ECC output. The previously stored ECC result is the same as was used in Steps 1 and 2 and is stored as part of the overhead data. As previously discussed in Steps 1 and 2, two outcomes can occur. The first outcome is a conclusion that the ECC output and the previously stored ECC output match. This outcome indicates the third data 518 is not corrupt and the third data 518 does not need to be processed further. With this first outcome, the original data stored within the memory block 302-1 is successfully retrieved. That is, in some embodiments, increasing the read pass voltages of the neighboring word lines and extended neighboring word lines that are disposed around a target word line can resolve an uncorrectable error.

The second outcome is the conclusion that the ECC output and the previously stored ECC output do not match. This outcome indicates the third data 518 is corrupt and the ECC engine 212 can perform further processing on the third data 518. For example the ECC engine 212 can execute a REH process where the ECC engine 212 can attempt to correct individual bits in the third data 518 which creates modified third data. After attempting to correct the individual bits in the third data 518, the ECC engine 212 can apply the ECC algorithm on the modified third data and create another ECC output.

Similar to Steps 1 and 2, if the ECC engine determines the two ECC outputs (e.g., as between the previously stored ECC output and the another ECC output) match, the ECC engine 212 can transmit an indication that the read error handling was successful. When the read error handling is successful at this point, the original data is recovered, which otherwise could not be recovered. However, if the ECC engine determines the two ECC output (e.g., as between the previously stored ECC output and the another ECC output) do not match, the ECC engine 212 can transmit an indication that the read error handling was unsuccessful or an uncorrectable error indication. The uncorrectable error can occur when the third data 518 includes more bits that are corrupt than the ECC engine 212 has the ability to correct.

In various embodiments, the process ends with the uncorrectable error and the original data is not recovered. In additional embodiments, as the original data is not recovered, the memory block 302-1 can be marked as faulty. Thus, not only can the described methods in FIGS. 5A-5C to attempt to recover data after encountering a read handling error, but the above methods can also be used to detect a faulty memory block in a memory system.

Figure 6:
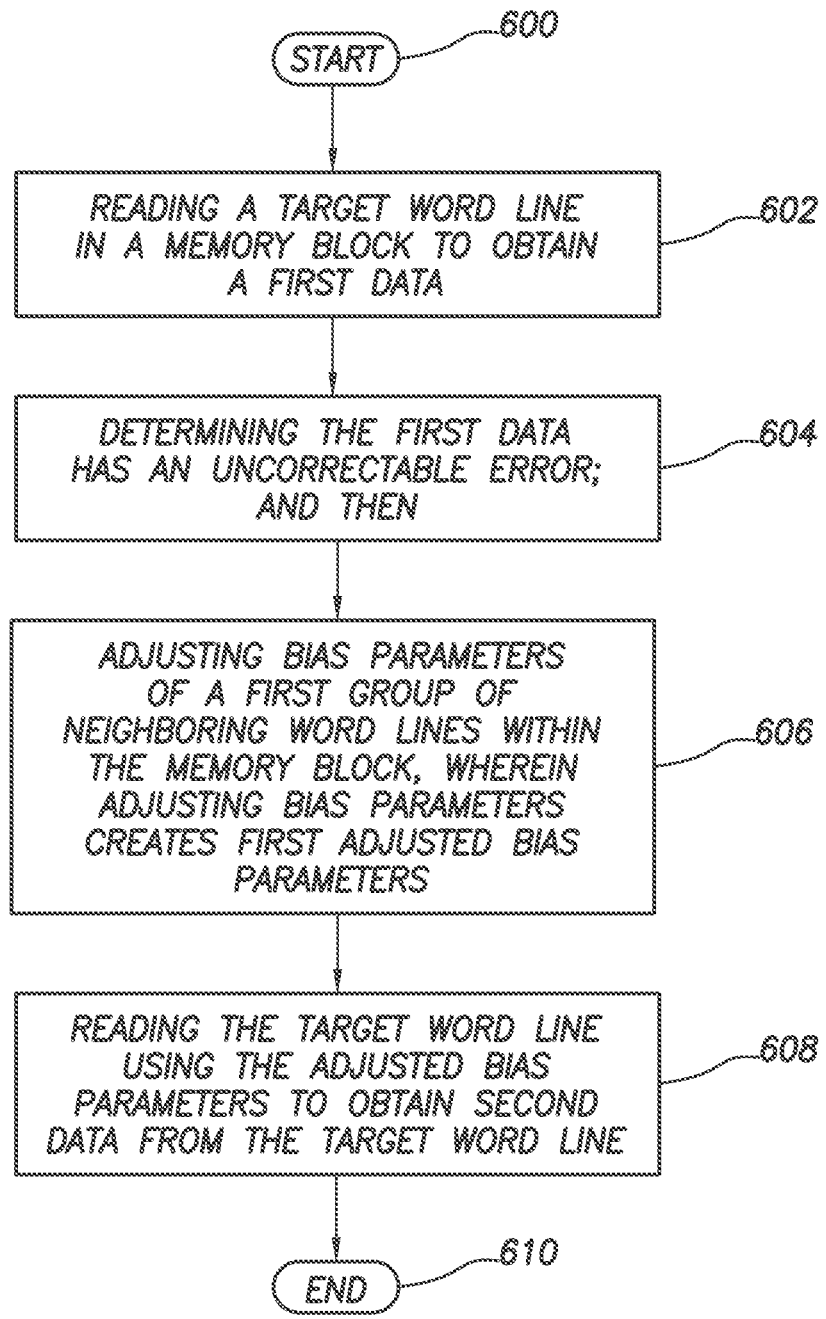
FIG. 6 illustrates a method diagram, in accordance with some embodiments.

FIG. 6 shows a method in accordance with at least some embodiments. In particular, the method starts (block 600) and includes: reading a target word line in a memory block to obtain a first data (block 602 and e.g., FIG. 5A); determining the first data has an uncorrectable error (block 604 and e.g., FIG. 5A), and then; adjusting bias parameters for a first group of neighboring word lines within the memory block, wherein adjusting bias parameters creates first adjusted bias parameters (block 606 and e.g., FIG. 5B); and reading the target word line using the adjusted bias parameters to obtain second data from the target word line (block 608 and e.g., FIG. 5B). Thereafter the method ends (block 610.)

Figure 7:
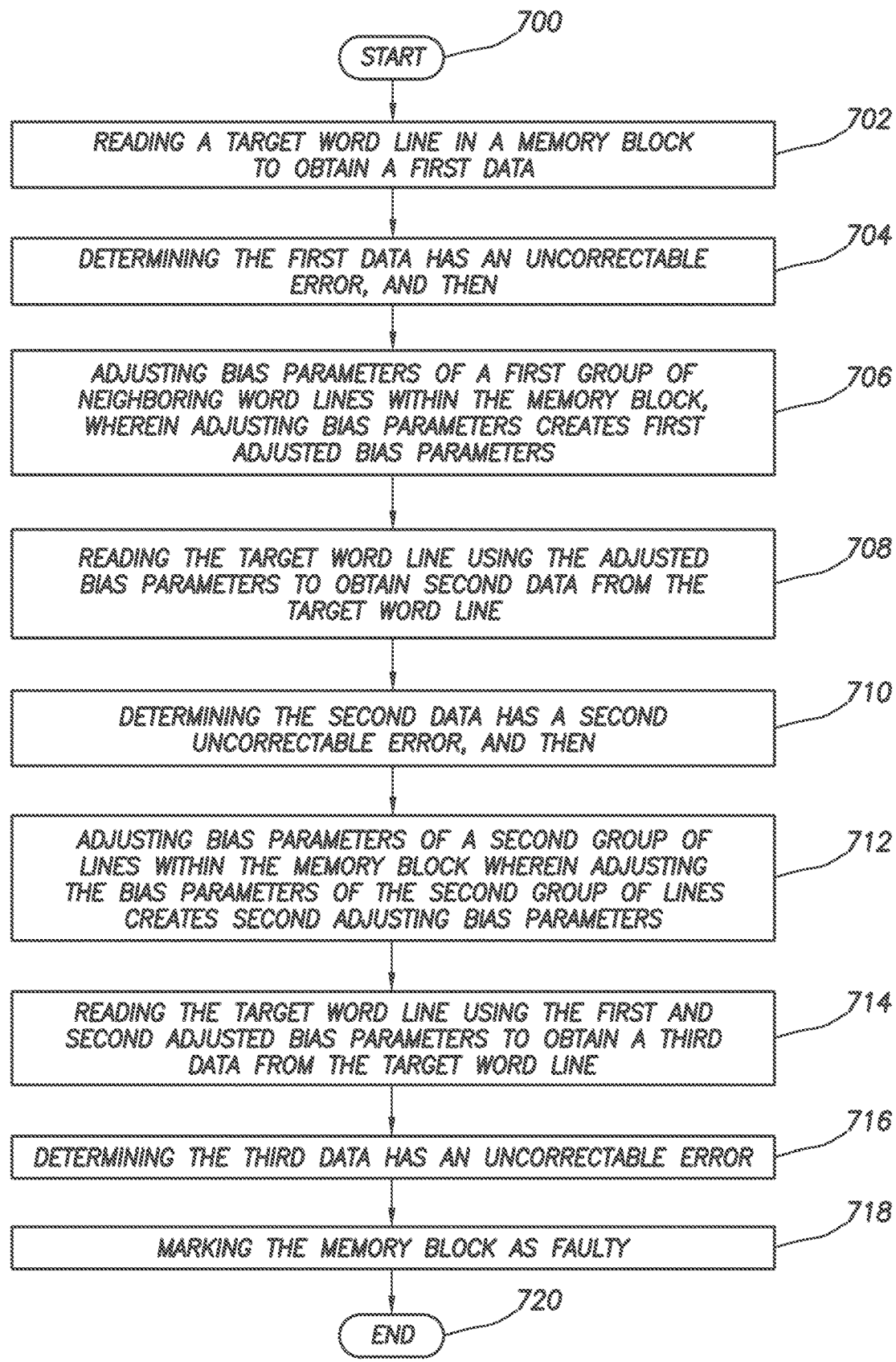
FIG. 7 illustrates a method diagram, in accordance with some embodiments.

FIG. 7 shows a method in accordance with at least some embodiments. In particular, the method starts (block 700) and includes: reading a target word line in a memory block to obtain a first data (block 702 and e.g., FIG. 5A); determining the first data has an uncorrectable error (block 704 and e.g., FIG. 5A), and then; adjusting bias parameters of a first group of neighboring word lines within the memory block, wherein adjusting bias parameters creates first adjusted bias parameters (block 706 and e.g., FIG. 5B); reading the target word line using the adjusted bias parameters to obtain second data from the target word line (block 708 and e.g., FIG. 5B).

The method continues with: determining the second data has a second uncorrectable error, (block 710 and e.g., FIG. 5B) and then; adjusting bias parameters of a second group of lines within the memory block, wherein adjusting the bias parameters of the second group of lines creates second adjusted bias parameters (block 712 and e.g., FIG. 5C); reading the target word line using the first and second adjusted bias parameters to obtain a third data from the target word line (block 714 and e.g., FIG. 5C); determining the third data has an uncorrectable error (block 716 and e.g., FIG. 5C), and marking the memory block as faulty (block 718 and e.g., FIG. 5C). Thereafter the method ends (block 720).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for recovering data from a faulty memory block in a memory system, the method comprising:
   reading a target word line in a memory block to obtain a first data;
   determining the first data has an uncorrectable error; and then
   adjusting bias parameters of a first group of neighboring word lines within the memory block, wherein adjusting bias parameters creates first adjusted bias parameters; and
   reading the target word line using the adjusted bias parameters to obtain second data from the target word line.

2. The method of claim 1, wherein adjusting the bias parameters of the first group of neighboring word lines further comprises:
   adjusting a read pass voltage of a first word line disposed immediately adjacent to the target word line, and the first word line disposed between a second word line and the target word line; and
   adjusting a read pass voltage of the second word line.

3. The method of claim 1, further comprising:
   determining the second data has a second uncorrectable error; and then
   adjusting bias parameters of a second group of lines within the memory block, wherein adjusting the bias parameters of the second group creates second adjusted bias parameters; and
   reading the target word line using the first and second adjusted bias parameters to obtain a third data from the target word line.

4. The method of claim 3, wherein adjusting the bias parameters of the second group of lines further comprises adjusting a select voltage of a select line of the memory block, wherein the select line is coupled to a select gate of the memory block.

5. The method of claim 4, wherein adjusting the bias parameters of the second group of lines further comprises adjusting a read pass voltage of a dummy word line within the memory block, wherein the dummy word line is disposed along a periphery of the memory block.

6. The method of claim 3, wherein adjusting the bias parameters of the second group of lines further comprises adjusting a read pass voltage of a dummy word line within the memory block, wherein the dummy word line is disposed along a periphery of the memory block.

7. The method of claim 3, wherein adjusting the bias parameters of the second group of lines comprises increasing an amount of voltage applied to the second group by a predetermined threshold amount.

8. The method of claim 1, wherein adjusting the bias parameters of the first group of neighboring word lines further comprises: increasing a first read pass voltage and a second read pass voltage by a predetermined amount, the first read pass voltage is applied to a first word line disposed immediately adjacent to the target word line and the first word line disposed between a second word line and the target word line, and the second read pass voltage is applied to the second word line during the read operation.

9. The method of claim 1, wherein determining the first data has an uncorrectable error further comprises:
   determining the first data has a decoding failure;

executing a read error handling routine on the first data; and determining the read error handling routine was unsuccessful in recovering the first data.

10. A memory controller, comprising:

a first terminal coupled to a memory block;

processing circuitry coupled to the first terminal; and a memory coupled to the processing circuitry, the memory storing computer-readable instructions that when executed by the processing circuitry, cause the memory controller to:

receive a first data and a first address of the first data, wherein the first address defines a target word line corresponding to a memory cell in the memory block;

determine the first data has an uncorrectable error; and then adjust first bias parameters of a first group of neighboring word lines within the memory block by a predetermined threshold; the adjusting creates first adjusted bias parameters, wherein the first group of neighboring word lines comprises a first word line immediately adjacent to the target word line;

read the target word line using the first adjusted bias parameters; and receive a second data from the first address.

11. The memory controller of claim 10, wherein when the instructions cause the memory controller to adjust the first bias parameters, the instructions further cause the memory controller to increase a read pass voltage of the first word line by the predetermined threshold.

12. The memory controller of claim 10, wherein the predetermined threshold is between 0.5 mV and 2 V.

13. The memory controller of claim 10, wherein the computer-readable instructions further cause the memory controller to:

determine the second data has a second uncorrectable error; and then adjust second bias parameters of a second group of lines within the memory block by a second predetermined threshold, the adjusting creates second adjusted bias parameters;

read the target word line using the first and second adjusted bias parameters; and receive a third data from the first address.

14. The memory controller of claim 13, wherein when the instructions cause the memory controller to adjust the second bias parameters, the instructions further cause the memory controller to:

increase a select voltage of a select line of the memory block; and increase a read pass voltage of a dummy word line of the memory block.

15. The memory controller of claim 14, wherein when the instructions cause the memory controller to adjust the second bias parameters, the instructions further cause the memory controller to increase a second select voltage of a second select line of the memory block.

16. The memory controller of claim 13 further comprising a read parameter adjustment module, wherein the memory controller adjusts the first and second bias parameters by way of the read parameter adjustment module.

* * * * *